United States Patent
Lin et al.

(10) Patent No.: US 11,036,911 B2
(45) Date of Patent: Jun. 15, 2021

(54) CHARGING PREVENTION METHOD AND STRUCTURE

(71) Applicant: Taiwan Semiconductor Manufacturing Co., Ltd., Hsinchu (TW)

(72) Inventors: Han-Chung Lin, Hsinchu (TW); Chung-Yi Lin, Hsinchu County (TW); Yen-Sen Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/730,406

(22) Filed: Dec. 30, 2019

(65) Prior Publication Data

US 2021/0097228 A1   Apr. 1, 2021

Related U.S. Application Data

(60) Provisional application No. 62/906,155, filed on Sep. 26, 2019.

(51) Int. Cl.
| | |
|---|---|
| *G06F 30/3953* | (2020.01) |
| *G06F 30/398* | (2020.01) |
| *G03F 1/36* | (2012.01) |
| *H01L 23/522* | (2006.01) |
| *H01L 23/00* | (2006.01) |
| *H01L 23/528* | (2006.01) |

(52) U.S. Cl.
CPC .......... *G06F 30/3953* (2020.01); *G03F 1/36* (2013.01); *G06F 30/398* (2020.01); *H01L 23/528* (2013.01); *H01L 23/5226* (2013.01); *H01L 24/13* (2013.01); *H01L 2224/13025* (2013.01)

(58) Field of Classification Search
CPC ...... G06F 30/3953; G06F 30/398; G03F 1/36; H01L 24/13; H01L 23/528; H01L 2224/13025; H01L 23/5226
See application file for complete search history.

(56) References Cited

U.S. PATENT DOCUMENTS

| | | | |
|---|---|---|---|
| 7,240,314 B1* | 7/2007 | Leung | G06F 30/39 257/773 |
| 7,260,803 B2* | 8/2007 | Lakshmanan | G06F 30/39 716/51 |

(Continued)

*Primary Examiner* — Nha T Nguyen
(74) *Attorney, Agent, or Firm* — Haynes and Boone, LLP

(57) ABSTRACT

A method of the present disclosure includes receiving a design layout; performing routing to the design layout to obtain a routed layout including an interconnect structure including a first metal layer, a second metal layer over the first metal layer, a third metal layer over the second metal layer, and a plurality of functional vias; performing optical proximity correction (OPC) operations to the routed layout to obtain an OPC'ed layout; and modifying the OPC'ed layout to obtain a modified layout. The modifying of the routed layout includes inserting a first plurality of dummy vias between the first metal layer and the second metal layer to avoid horizontal bridging between two adjacent metal lines in the first metal layer, and inserting a second plurality of dummy vias between the second metal layer and the third metal layer to avoid vertical coupling to the first plurality of dummy vias.

20 Claims, 7 Drawing Sheets

(56) References Cited

U.S. PATENT DOCUMENTS

| | | | |
|---|---|---|---|
| 7,408,206 B2* | 8/2008 | DeVries | H01L 23/535 257/127 |
| 7,574,685 B1* | 8/2009 | Dong | G06F 30/39 716/118 |
| 7,949,981 B2* | 5/2011 | Greco | G06F 30/39 716/119 |
| 8,307,321 B2* | 11/2012 | Liu | G06F 30/394 716/122 |
| 8,847,393 B2* | 9/2014 | Hoang | H01L 23/528 257/750 |
| 9,262,568 B2* | 2/2016 | Fu | G06F 30/39 |
| 9,520,362 B2 | 12/2016 | Lin et al. | |
| 9,613,856 B1 | 4/2017 | Yang et al. | |
| 9,716,032 B2 | 7/2017 | Tang et al. | |
| 9,852,249 B2* | 12/2017 | Lum | H01L 27/088 |
| 9,972,529 B2 | 5/2018 | Yang et al. | |
| 10,043,966 B2* | 8/2018 | Bak | H01L 43/10 |
| 10,163,691 B2 | 12/2018 | Shih et al. | |
| 10,170,322 B1 | 1/2019 | Cheng et al. | |
| 10,552,567 B2* | 2/2020 | Civay | G06F 30/392 |
| 10,777,510 B2* | 9/2020 | Lin | H01L 23/522 |
| 2002/0185664 A1* | 12/2002 | Dixit | H01L 21/76838 257/211 |
| 2003/0204832 A1* | 10/2003 | Matumoto | G06F 30/39 716/52 |
| 2005/0248033 A1* | 11/2005 | Ryan | H01L 21/76838 257/758 |
| 2006/0195813 A1* | 8/2006 | Selvaraj | G06F 30/39 257/773 |
| 2007/0013072 A1* | 1/2007 | Ellis-Monaghan | H01L 27/0248 257/758 |
| 2007/0029641 A1* | 2/2007 | Hamatani | H01L 23/562 257/620 |
| 2007/0262454 A1* | 11/2007 | Shibata | H01L 23/522 257/758 |
| 2008/0120586 A1* | 5/2008 | Hoerold | G06F 30/39 716/52 |
| 2009/0087956 A1* | 4/2009 | Rao | H01L 21/7684 438/233 |
| 2009/0089732 A1* | 4/2009 | van Adrichem | G06F 30/39 716/119 |
| 2009/0230562 A1* | 9/2009 | Kondou | H01L 23/522 257/774 |
| 2010/0031221 A1* | 2/2010 | Greco | G06F 30/39 716/130 |
| 2010/0224977 A1* | 9/2010 | Kim | H01L 25/0657 257/686 |
| 2010/0242008 A1* | 9/2010 | Liu | G06F 30/394 716/108 |
| 2011/0289471 A1* | 11/2011 | Anikin | G06F 30/39 716/132 |
| 2013/0105990 A1* | 5/2013 | Shibata | H01L 23/481 257/774 |
| 2016/0111360 A1* | 4/2016 | Cho | H01L 21/784 257/774 |
| 2019/0051600 A1* | 2/2019 | Oh | H01L 23/5226 |

* cited by examiner

CHARGING PREVENTION METHOD AND STRUCTURE

PRIORITY DATA

This application claims priority to U.S. Provisional Patent Application Ser. No. 62/906,155 filed on Sep. 26, 2019, the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

An IC chip includes an interconnect structure to interconnect various active and passive devices in the IC chip. The interconnect structure includes multiple layers of conductive lines embedded in multiple intermetallic dielectric (IMD) layers, with conductive lines in different layer connected by contact vias formed in each of the multiple IMD layers. While these conductive lines and contact vias (collectively, conductive patterns) meet interconnection needs, they may not be distributed uniformly. The non-uniformly distributed conductive patterns may include isolated regions (or loosely packed regions) regions that may polish at a different rate in chemical mechanical polishing (CMP) process, resulting in dishing or erosion. Dummy vias (i.e., non-functional vias) have been inserted into isolated regions to remedy the non-uniform distribution of conductive patterns. Sometimes the inserted dummy vias help form a floating daisy chain block that expands through multiple IMD layers. Charges may be generated due to exposure to plasma during fabrication process and accumulate in the floating daisy chain block. As the geometry size of the devices in the IC chip shrinks, thicknesses of IMD layers and interlayer dielectric (ILD) layers also reduce. The accumulated charge may cause breakdown of the IMD or ILD layers of reduced thicknesses. Therefore, while the conventional integrated circuits are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
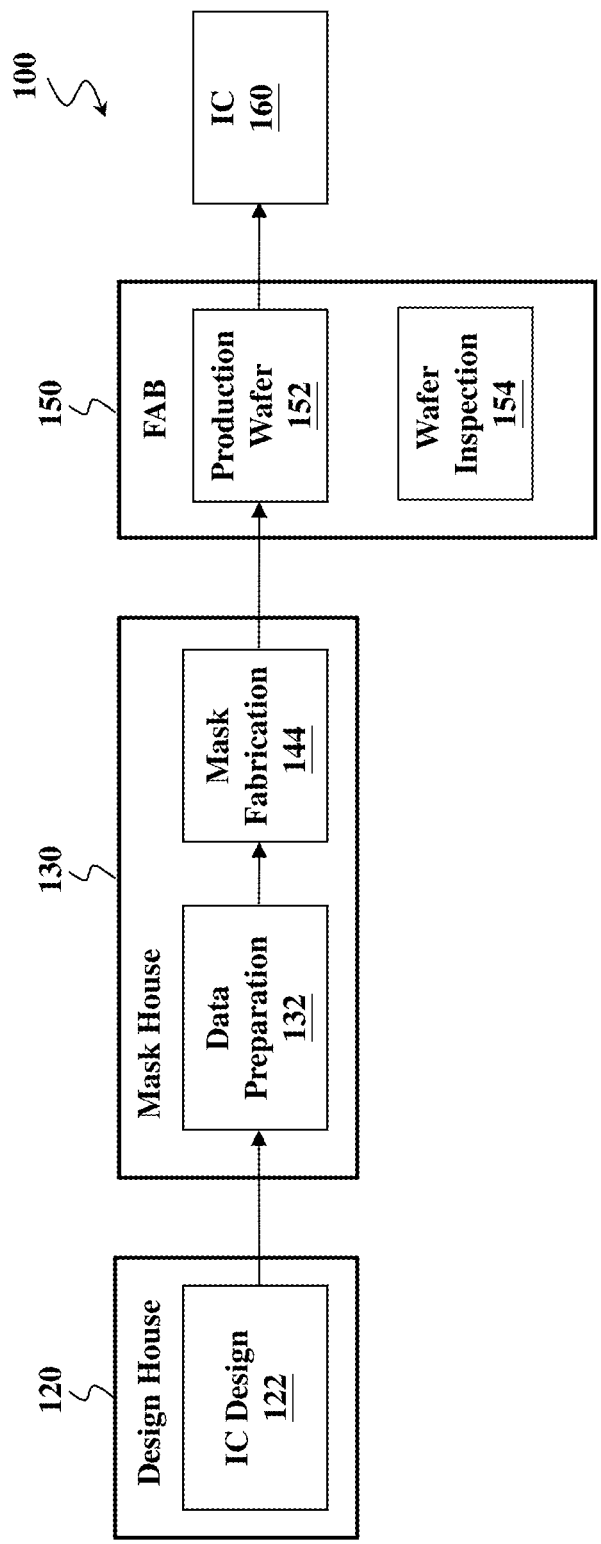
FIG. 1 is a simplified block diagram of an integrated circuit (IC) manufacturing system and associated IC manufacturing flow, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is related to a method and a structure to prevent plasma induced damages. In some embodiments of the present disclosure, the method includes reducing a number of dummy (non-functional) vias that are vertically aligned with another overlying or underlying dummy via coupled to an overlying via, removing dummy vias that horizontally bridge a dummy interconnect block and an operational interconnect block, and reducing a total number of dummy vias that couple two vertically adjacent layers. When the method of the present disclosure is followed to insert dummy vias, it is less likely for the resulting structure to include a floating daisy chain block that can be charged by exposure to plasma. Without a floating daisy chain block, the risk of breakdown of IMD/ILD layers due to charge accumulation is alleviated.

Reference is first made to FIG. 1, which illustrates a simplified block diagram of an integrated circuit (IC) manufacturing system 100 and associated IC manufacturing flow, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities is connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. Additionally, the IC design layout 122 may include overlay test pattern cells, in accordance with embodiments of the present disclosure. In various examples, the design house 120 implements a design procedure to form the IC design layout 122. The design procedure may include logic design, physical design, and/or placement and routing. The IC design layout 122 may be presented in one or more data files having information related to the geometrical patterns which are to be used for fabrication of the IC device 160. In some examples, the IC design layout 122 may be expressed in a GDSII file format or DFII file format.

In some embodiments, the design house 120 may transmit the IC design layout 122 to the mask house 130, for example, via the network connection described above. The mask house 130 may then use the IC design layout 122 to manufacture one or more masks to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes as known in the art. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof. In addition, the mask data preparation 132 may also include insertion of dummy metal lines and dummy vias into isolated (loosely packed) regions to improve pattern density. For example, the mask data preparation 132 may include a method for inserting dummy vias, such as method 600, to be described below. The mask data preparation 132 modifies the IC design layout 122 to output a modified IC design layout 122 for further processing. In some embodiments represented in FIG. 1, the mask data preparation 132 is performed by the mask house 130. In other embodiments, the mask data preparation 132 may be partially or wholly performed by the IC manufacturer 150 that is better equipped to assess process-related attributes.

After mask data preparation 132 and during mask fabrication 144, a mask or a group of masks may be fabricated based on the modified IC design layout 122. For example, an electron-beam (e-beam) writer or a mechanism of multiple e-beams is used to form a pattern on a mask (photomask or reticle) based on the modified IC design layout 122. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business (e.g., research and development). In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps).

Figure 2:
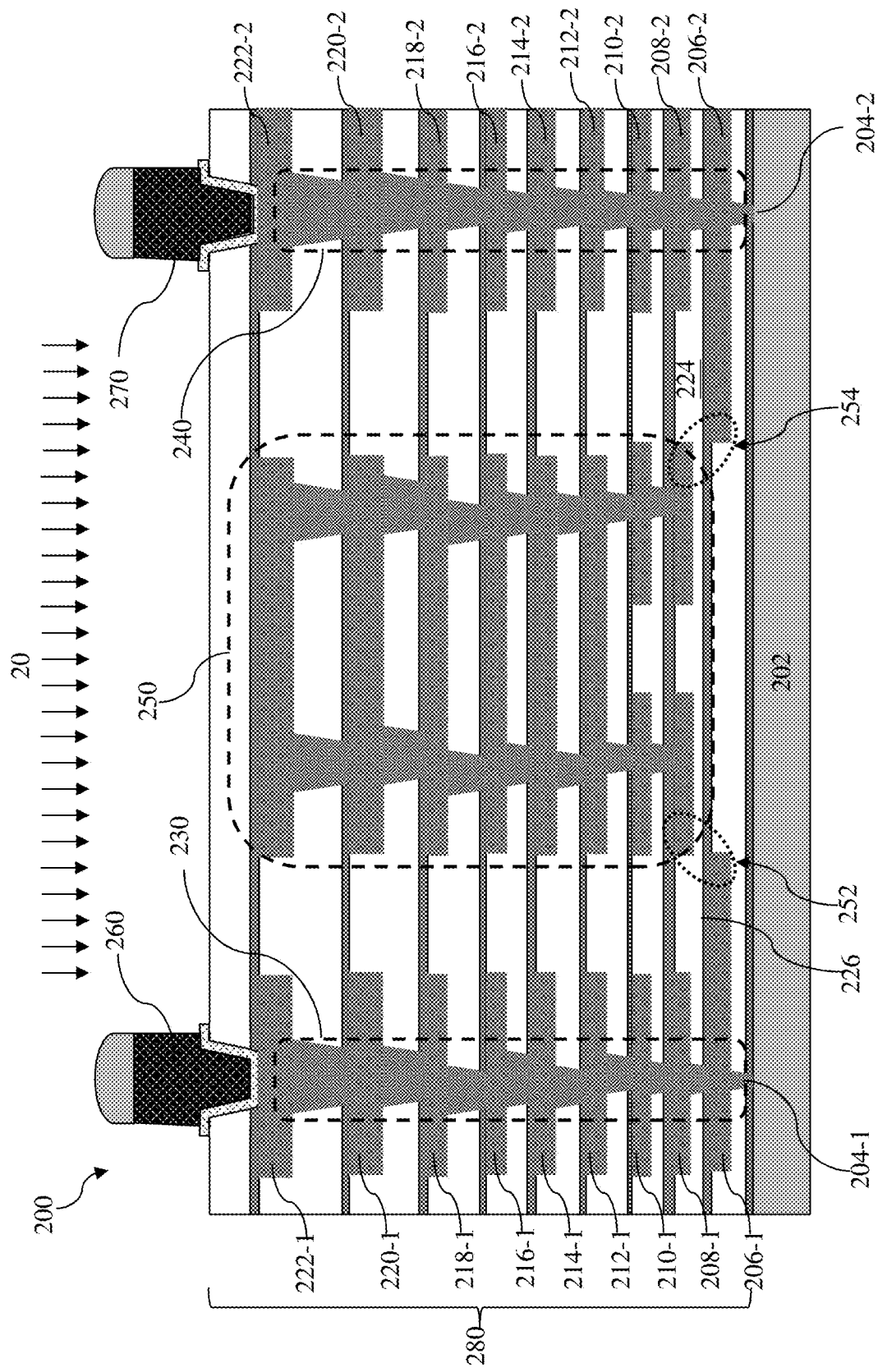
FIG. 2 illustrates a cross-sectional view of a semiconductor device that includes a floating daisy chain block, according to aspects of the present disclosure.

Reference is now made to FIG. 2, which illustrates a cross-sectional view of a semiconductor device 200 that includes a floating daisy chain block 250. The semiconductor device 200 includes a substrate 202. The substrate 202 may include various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The substrate 202 may include an interconnect structure 280 that interconnects devices in the substrate 202 and couples the devices in the substrate 202 to external circuitry.

As shown in FIG. 2, the interconnect structure 280 includes multiple conductive lines 206-1, 206-2, 208-1, 208-2, 210-1, 210-2, 212-1, 212-2, 214-1, 214-2, 216-1, 216-2, 218-1, 218-2, 220-1, 220-2, 222-1, and 222-2 formed in multiple intermetallic dielectric (IMD) layers. One of the multiple IMD layers is the IMD layer 224. The multiple IMD layers are divided by multiple etch stop layers (ESL). One of the multiple ESLs is the ESL 226, which may be formed of silicon nitride. Conductive lines 206-1 and 206-2 are disposed within the same IMD layer. Similarly, each pair of the conductive lines 208-1 and 208-2, 210-1 and 210-2, 212-1 and 212-2, 214-1 and 214-2, 216-1 and 216-2, 218-1 and 218-2, 220-1 and 220-2, and 222-1 and 222-2 are disposed within the same IMD layer. The semiconductor device 200 includes a first contact via 204-1 and a second contact via 204-2 that are electrically coupled to a device formed in the substrate 202. By way of the conductive lines 206-1, 208-1, 210-1, 212-1, 214-1, 216-1, 218-1, 220-1, and 222-1 and a first series of contact vias 230, the first contact via 204-1 is electrically coupled to a first bump 260 for connection to an external circuit. Similarly, by way of the conductive lines 206-2, 208-2, 210-2, 212-2, 214-2, 216-2, 218-2, 220-2, and 222-2 and a second series of contact vias 240, the second contact via 204-2 is electrically coupled to a second bump 270 for connection to an external circuit. The second contact via 204-2, the conductive lines, the first series of contact vias 230, and the second series of contact vias 240 are functional conductive lines and contact vias that electrically couple devices in the substrate 202 to the outside world.

Figure 3:
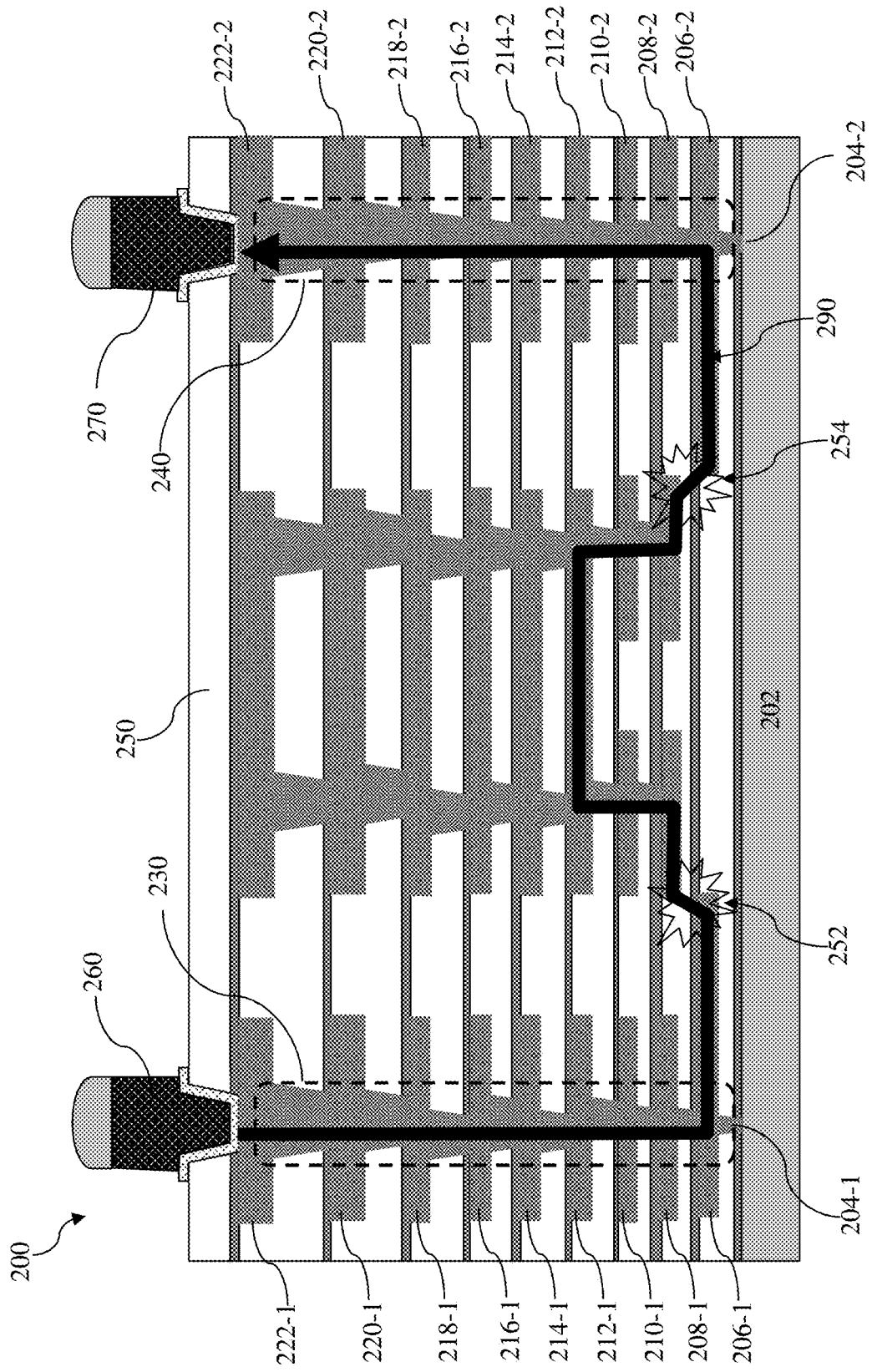
FIG. 3 illustrates a short circuit loop as a result of plasma charging of the floating daisy chain block in FIG. 2, according to aspects of the present disclosure.

Reference is briefly made to FIG. 1. When conductive pattern density uniformity is the primary concern, dummy vias may be generously inserted into the IC design layout 122 at mask data preparation 132 to bring the low pattern density in isolated regions to the high pattern density in dense regions. In those cases, the inserted dummy vias may interconnect multiple dummy vias and multiple dummy conductive lines to form a floating daisy chain block. Referring back to FIG. 2, the semiconductor device 200 also includes one of such floating daisy chain blocks—floating daisy chain block 250. The floating daisy chain block 250 is electrically floating and is not coupled to any of the functional conductive lines, functional contact vias, devices formed in the substrate 202, or the bumps 260 or 270. As shown in FIG. 2, the floating daisy chain block 250 may approach the conductive line 206-1 at a first proximity point 252 and the conductive line 206-2 at a second proximity point 254. At each of the first proximity point 252 and the second proximity point 254, the floating daisy chain block 250 is electrically insulated from the functional conductive patterns (the conductive lines 206-1, 206-2, and all conductive lines and contact vias coupled thereto) by a thickness of the IMD layer 224 and the ESL 226. During fabrication of the semiconductor device 200, a plasma 20 may be generated over the semiconductor device 200 to facilitate deposition or etching of various layers. It has been observed that the floating daisy chain block 250 may serve as an "antenna" to be charged by the plasma 20. Charge induced by the plasma 20 may accumulate in the floating daisy chain block 250. In some instances, when sufficient charge is accumulated in the floating daisy chain block 250, dielectric breakdown may take place at the first proximity point 252 and the second proximity point 254. A short circuit loop 290 in FIG. 3 may be resulted. Through the short circuit loop 290, the first bump 260 is shorted to the second bump 270.

Figure 4:
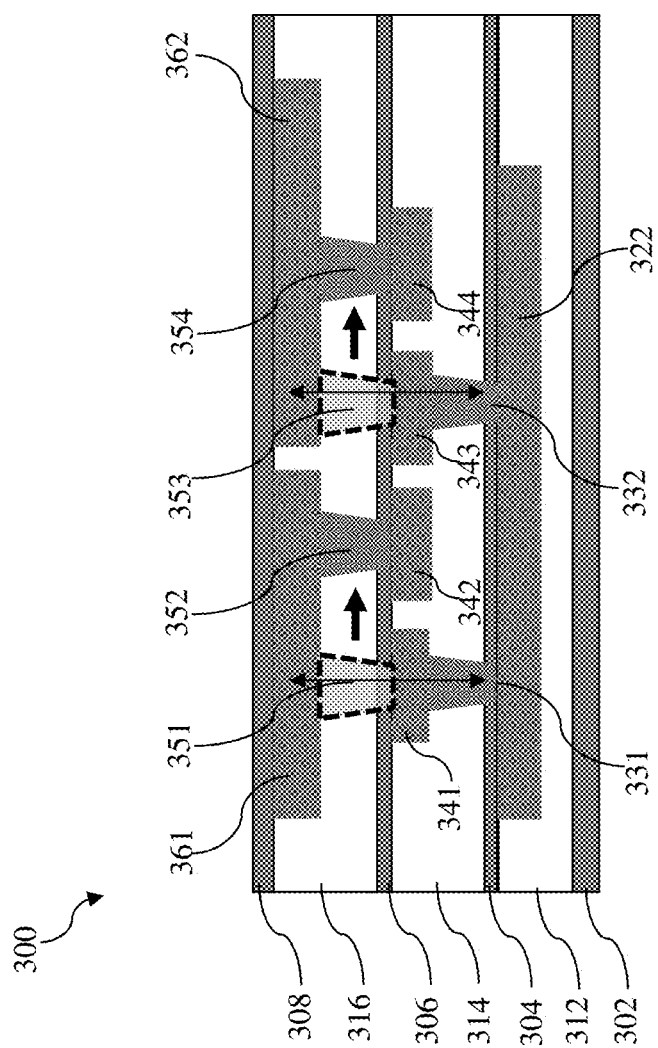
FIGS. 4-6 illustrate mechanisms to avoid the short circuit loop in FIG. 3, according to aspects of the present disclosure.

The present disclosure provides example mechanisms to prevent formation of floating daisy chain blocks. A first example mechanism, which is to reduce/avoid vertical coupling, is described in conjunction with a first fragmentary interconnect structure 300 in FIG. 4. The first fragmentary interconnect structure 300 includes a plurality of etch stop layers (ESLs) 302, 304, 306, and 308 and a plurality of IMD layers 312, 314, and 316. The IMD layer 312 includes a conductive line 322; the IMD layer 314 includes conductive lines 341, 342, 343, and 344; and the IMD layer 316 includes conductive lines 361 and 362. The conductive line 341 and the conductive line 343 are vertically coupled to the conductive line 322 by contact via 331 and 332, respectively. When the contact via 351 is implemented, conductive lines 361, 341, and 322 become electrically coupled as the contact via 351 and the contact via 331 are both coupled to the conductive line 341. However, when the contact via 352 is implemented instead, conductive line 361 is only coupled to the floating conductive line 342, not to the conductive line 322 below. That is, by avoiding connecting both a contact via and an overlying contact via to the same conductive line, less conductive lines may become interconnected. The first example mechanism therefore may reduce vertical coupling of conductive lines in different layers. Similarly, when the contact via 353 is implemented, conductive lines 362, 343, and 322 become electrically coupled as the contact via 353 and the contact via 332 are both coupled to the conductive line 343. However, when the contact via 354 is implemented instead, conductive line 362 is only coupled to the floating conductive line 344, not to the conductive line 322 below. It can be seen that, even if a floating daisy chain block is formed, applying the first example mechanism may reduce mass/volume of the floating daisy chain block, thereby reducing the amount of charge stored in the floating daisy chain block.

Figure 5:
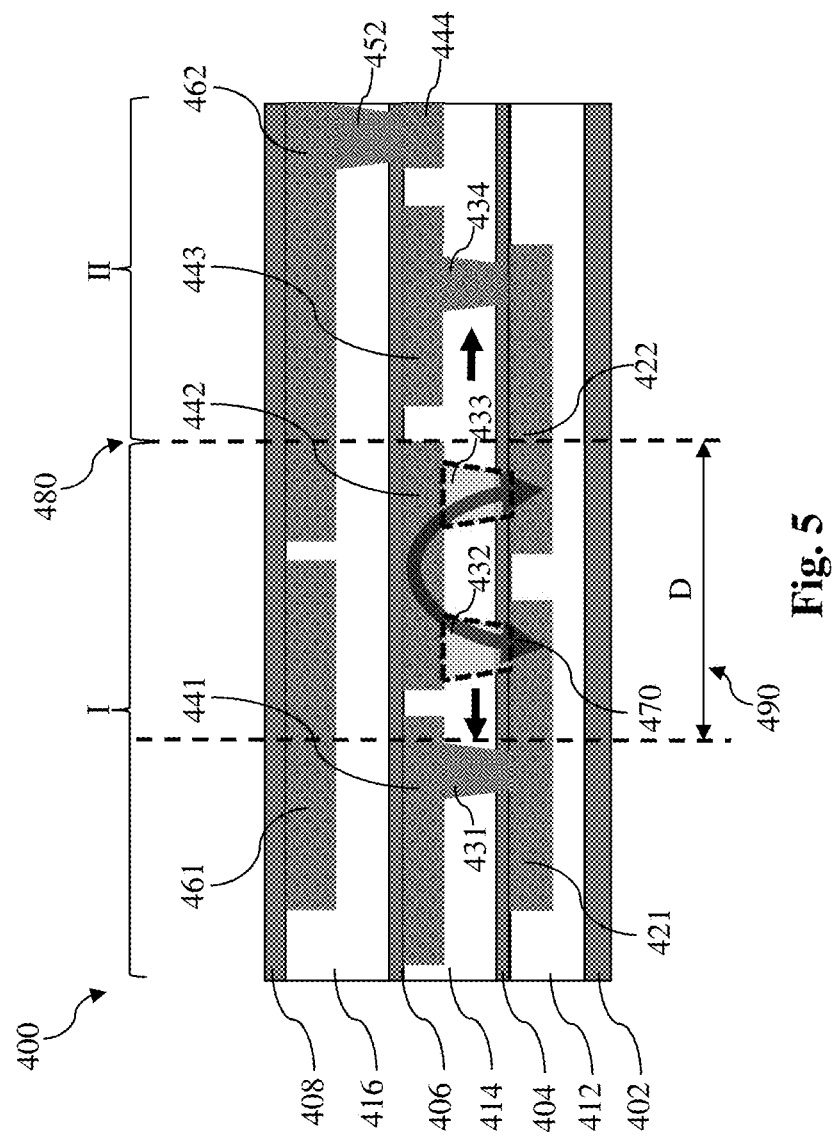

A second example mechanism, which is to reduce/avoid horizontal bridging, is described in conjunction with a second fragmentary interconnect structure 400 in FIG. 5. The second fragmentary interconnect structure 400 includes a plurality of etch stop layers (ESLs) 402, 404, 406, and 408 and a plurality of IMD layers 412, 414, and 416. The IMD layer 412 includes conductive lines 421 and 422; the IMD layer 414 includes conductive lines 441, 442, 443, and 444; and the IMD layer 316 includes conductive lines 461 and 462. Conductive lines 421 and 422 in the IMD layer 412 are not electrically coupled together by any feature in the IMD layer 412. When the contact vias 432 and 433 are implemented, a conduction path 470 that includes the contact via 432, the contact via 433, and the conductive line 442 may be formed to bridge the conductive lines 421 and 422. However, when the contact vias 431 and 434 are implemented instead, no conduction path is formed to bridge the conductive lines 421 and 422. That is, by avoiding forming a conduction path bridge two horizontally-spaced conductive lines, less conductive lines may become interconnected. The second example mechanism therefore may reduce horizontal coupling of conductive lines disposed within the same interconnect layer. In some embodiments, the fragmentary interconnect structure 400 is disposed at a boundary 480 between region I and region II. In some implementations, region I includes OPC features, such as scattering bars, serifs, hammerheads, OPC dummy conductive lines (i.e., OPC dummy metal lines) and may be referred to as an OPC region. Region II does not include any OPC features and may be referred to as a non-OPC region. Region I may be adjacent to a functional feature that may be affected by OPC corrections. Region II may be spaced apart from any function feature that may be affected by OPC corrections. In general, conductive lines in region I tend to be smaller in dimension that those in region II. In some embodiments, the second example mechanism may not include identification of two horizontally-spaced-apart conductive lines within the same layer. In those embodiments, a computer program or algorithm may be executed by a computing device to identify the boundary 480 and then define a dummy-via-free zone 490. In some instances, the dummy-via-free zone 490 is defined by a buffer distance D measured from the boundary 480. In some implementations, the buffer distance D is between about 0.5 µm and about 2 µm. In embodiments represented by FIG. 5, contact via 452 in the IMD layer 416 does not fall within the dummy-via-free zone 490.

Figure 6:
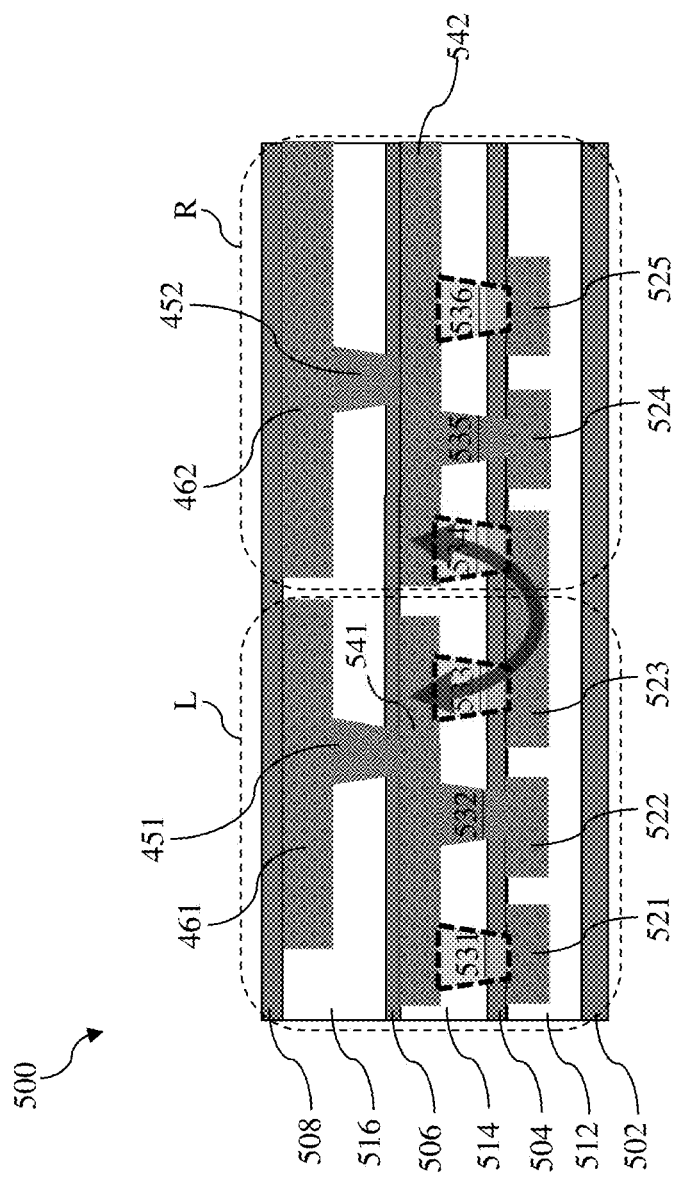

A third example mechanism, which is to reduce dummy via density, is described in conjunction with a third fragmentary interconnect structure 500 in FIG. 6. The third fragmentary interconnect structure 500 includes a plurality of etch stop layers (ESLs) 502, 504, 506, and 508 and a plurality of IMD layers 512, 514, and 516. The IMD layer 512 includes conductive lines 521, 522, 523, 524, and 525; the IMD layer 514 includes conductive lines 541 and 542; and the IMD layer 516 includes conductive lines 461 and 462. When conventional dummy via insertion method is adopted, dummy vias 531, 532, 533, 534, 535, and 536 electrically couple conductive lines 521, 522, 523, 524, and 525 in the IMD layer 512 to conductive lines 541 and 542 in the IMD layer 514. In addition, dummy vias 451 and 452 electrically couple conductive lines 541 and 542 in the IMD layer 514 to conductive lines 461 and 462 in the IMD layer 516. Particularly, dummy vias 533 and 534 help horizontally bridge the conductive lines 541 and 542 in the IMD layer 514, thereby electrically coupling a first daisy chain block L and a second daisy chain block R. Each of the first daisy chain block L and the second daisy chain block R includes a plurality of interconnected contact vias and conductive lines. However, when the number of dummy vias in the IMD layer 514 is reduced by removing (or not inserting) dummy vias 531, 533, 534, and 536, the electrical coupling between the first daisy chain block L and the second daisy chain block R is severed. In some examples, the density or number of dummy vias within an IMD layer may be reduced by between about 10% and about 20%. The reduction of dummy vias not only may reduce horizontal bridging illustrated in FIG. 6 but also may reduce vertical coupling between conductive line layers.

Figure 7:
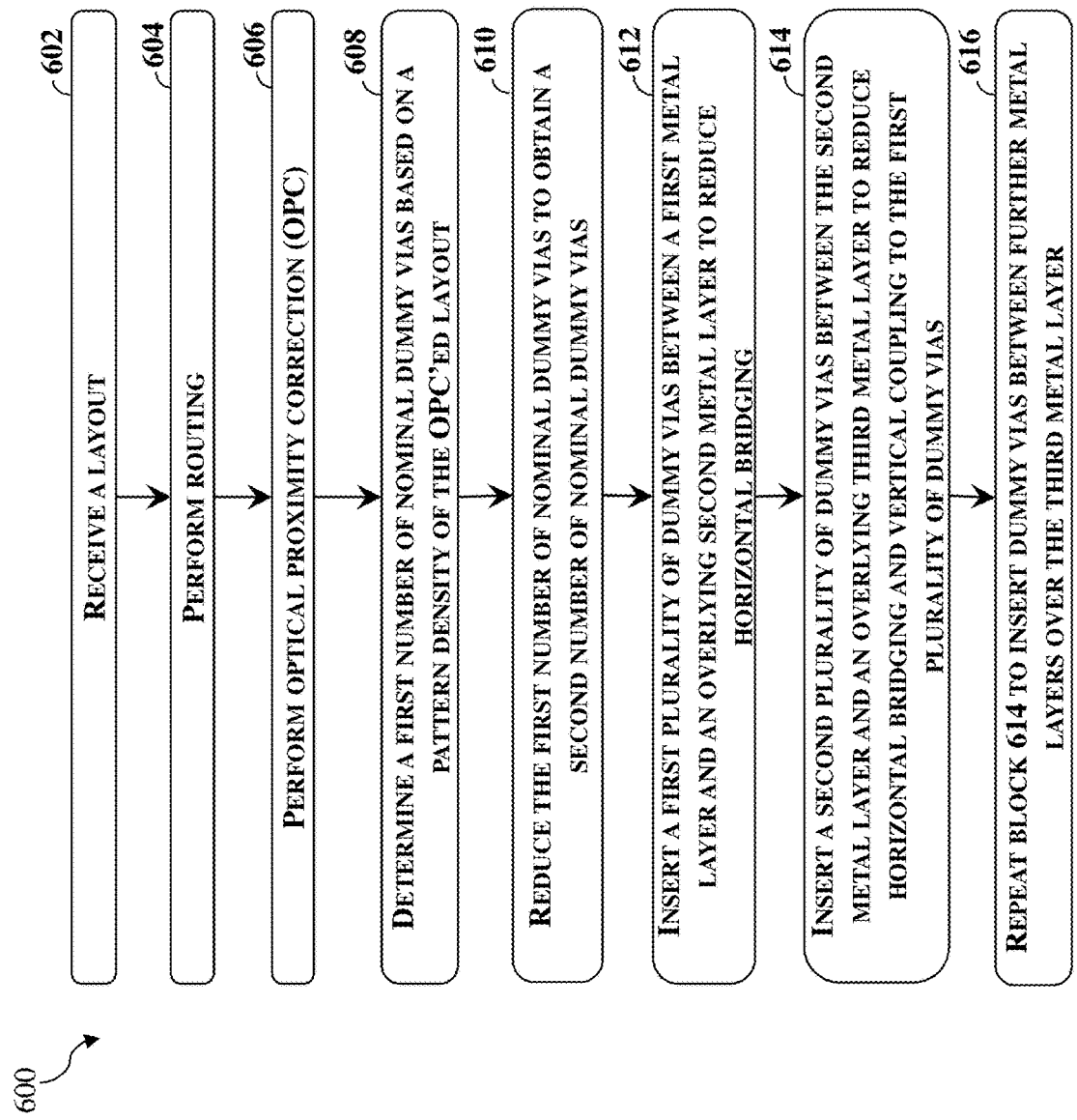
FIG. 7 illustrates a flowchart of a method for insertion of dummy vias, according to aspects of the present disclosure.

FIG. 7 illustrates a flowchart of a method 600 for insertion of dummy vias. The method 600 utilizes the three example mechanisms described above and may be performed by a dummy via insertion system that includes a computing device that executes one or more software programs. Due to the complexity of modern-day IC designs and the number of conductive patterns, the method 600 may be not performed by a human being. Method 600 includes a block 602 where a layout is received. In some embodiments, the layout may include a plurality of active devices and a plurality of passive devices.

Referring still to FIG. 7, the method 600 includes a block 604 where routing is performed to the layout. At block 604, a design of an interconnect structure may be created to functionally interconnect the plurality of active devices and the plurality of passive devices in the layout. The interconnect structure includes a plurality of metal layers (i.e., conductive line layers). In some implementations, each of the plurality of metal layers includes an intermetallic dielectric (IMD) layer and multiple conductive patterns. In some instances, each of the plurality of metal layers may include an etch stop layer (ESL). The routing operation at block 604 may take into consideration of subsequent operations. For example, routing operations at block 604 is to leave room for optical proximity correction (OPC) features that may be inserted at block 606. In some instances, if the routing operations at block 604 does not consider OPC, conductive lines may come in contact with OPC features, resulting in electrical shorts.

Referring to FIG. 7, the method 600 includes a block 606 where optical proximity correction (OPC) is performed to the layout. In some embodiments, the OPC operations at block 606 include adjusting line widths depending on the density of surrounding geometries, adding "dog-bone" end-caps to the end of lines to prevent line end shortening, correction for electron beam (e-beam) proximity effects, or inserting of dummy metal features (i.e., dummy conductive lines). For example, OPC operations at block 606 may add sub-resolution assist features (SRAFs), which for example may include adding scattering bars, serifs, and/or hammerheads to the layout received at block 602 according to optical models or rules such that, after a lithography process, a final pattern on a wafer is improved with enhanced resolution and precision. Because OPC features only affect photolithography patterning when placed within a distance from a main feature (such as a functional metal layer or functional conductive line of a small dimension), the layout may include a plurality OPC regions around main features and a plurality of non-OPC regions outside the plurality of OPC regions. For ease of reference, after OPC operations at block 606 are performed to the layout, the layout may be referred to as OPC'ed layout.

Referring to FIG. 7, the method 600 includes a block 608 where a first number of nominal dummy vias based on a pattern density of the OPC'ed layout is determined. In some embodiments, the OPC'ed layout includes dense (i.e., densely packed) regions and isolated (i.e., loosely packed) regions. To prevent dishing or erosion in the isolated regions due to subsequent CMP processes, a first number of nominal dummy vias may be inserted at block 608 to close the pattern density gap between the dense regions and the isolated regions. In some embodiments, operations at block 608 may represent the conventional method to insert dummy vias. At block 608, no horizontal bridging and vertical coupling are taken into consideration yet.

Referring to FIG. 7, the method 600 includes a block 610 where the first number of nominal dummy vias is reduced to obtain a second number of nominal dummy vias. As described above in the third example mechanism represented by FIG. 6, the first number of nominal dummy vias is reduced by between about 10% and about 20% to obtain a second number of dummy vias. That is, the second number is between about 80% and about 90% of the first number. Given the same total area in each of the plurality of metal layers, the reduction from the first number to the second number also results in between about 10% and about 20% of reduction in pattern density. The reduction of pattern density may generally reduce probability of horizontal bridging of horizontally spaced conductive lines and probability of vertical coupling between conductive lines in adjacent metal layers. In some embodiments, method 600 for inserting dummy vias may conclude at block 610 as block 610 may sufficiently avoid large floating daisy chain structure. In those embodiments, the dummy vias to be inserted include the second number of nominal dummy vias. In some alternative embodiments, method 600 proceeds to blocks 612 and 614 after performance of operations at block 610. In still other alternative embodiments, method 600 omits block 610 and proceeds directly to blocks 612 and 614. In some embodiments, block 610 of method 600 is only performed to non-OPC regions to reduce the first nominal dummy vias in non-OPC regions.

Referring to FIG. 7, the method 600 includes a block 612 where a first plurality of dummy vias is inserted between a first metal layer and an overlying second metal layer so as to reduce horizontal bridging. In some instances, block 612 practices the first example mechanism represented in FIG. 5 based on the reduced second number of nominal dummy vias. In some other instances, block 612 practices the first example mechanism based on the first number of nominal dummy vias. In some embodiments, the first metal layer may be the metal layer disposed immediately over a substrate that includes fabricated active devices. In some embodiments, the first metal layer may be electrically connected to fabricated active devices in a substrate by MEOL contact features, such as source/drain contacts or gate contacts. In some implementations, the second metal layer that overlies the first metal layer is disposed immediately over the first metal layer. In some embodiments, block 612 includes identifying potentially bridging conductive lines (or potentially bridging metal lines) in the second metal layer. Here, a potentially bridging conductive line in the second metal layer is one that vertically overlaps two immediately horizontally spaced conductive lines. Once the potentially bridging conductive lines are identified, block 612 may remove/cancel any of the second number of nominal dummy vias that are electrically coupled to the potentially bridging conductive lines to prevent the potentially bridging conductive lines from landing on vertically overlapping conductive lines in the first metal layer. By preventing the potentially bridging conductive lines from landing, any horizontal bridging by the potentially bridging conductive lines is avoided.

In some alternative embodiments, block 612 does not identify potentially bridging conductive lines in the second metal layer. Instead, block 612 includes operations to identify boundaries between OPC regions and non-OPC regions and dummy-via-free zones immediate adjacent the boundaries. In these alternative embodiments, block 612 removes/cancels dummy vias in the dummy-via-free zones. In these alternative embodiments, block 612 is only performed with respect to boundaries between OPC regions and non-OPC regions.

Referring to FIG. 7, the method 600 includes a block 614 where a second plurality of dummy vias is inserted between the second metal layer and an overlying third metal layer so as to reduce horizontal bridging and vertical coupling to the first plurality of dummy vias. In some instances, block 614 practices both the first example mechanism represented in FIG. 4 and the second example mechanism represented in FIG. 5 based on the reduced second number. In some other instances, block 614 practices both the first example mechanism and the second example mechanism based on the first number of nominal dummy vias. Operations at block 614 to prevent horizontal bridging are similar to those described above with respect to block 612 and are not repeated here. Block 614 is different from block 612 in the sense that block 614 requires further consideration to avoid vertical coupling to down to the dummy vias between the first metal layer and the second metal layer, as have been determined at this point. To practice the first example mechanism, block 614 identifies connected conductive lines in the second metal layer. Here, a connected conductive line in the second metal layer is a conductive line that is electrically coupled to at least one of the dummy vias between the first metal layer and the second metal layer. Thereafter, block 614 removes/cancels the first or second number of nominal dummy vias (between the second metal layer and the overlying third metal layer, depending on whether block 614 is based on the first number of dummy vias or the second number of dummy vias) that are electrically coupled to the connected conductive lines. By preventing the further dummy vias to couple to connected conductive lines below, vertical coupling between the conductive lines in the third metal layer and the conductive lines in the second metal layer is avoided.

Referring to FIG. 7, the method 600 includes a block 616 where operations in block 614 are repeated to insert dummy vias between further metal layers over the third metal layer. In some embodiments, the interconnect structure for the layout may include further metal layers. Block 616 repeats operations in block 614 to insert dummy vias between the third metal layer and further metal layers. For example, the interconnect structure for the layout may include 9 metal layers. In that example, block 616 may repeat operations in block 614 to insert dummy vias between the third metal layer and the fourth metal layer, the fourth metal layer and the fifth metal layer, the fifth metal layer and the sixth metal layer, the sixth metal layer and the seventh metal layer, the seventh metal layer and the eighth metal layer, and the eighth metal layer and the ninth metal layer. For each inter-metal-layer dummy via layer, horizontal bridging within the same metal layer is avoided by practicing the second example mechanism shown in FIG. 5 and vertical coupling between two adjacent metal layers is avoided by practicing the first example mechanism. In some embodiments, the number of dummy vias to be inserted include the second number of dummy vias minus the dummy vias removed/canceled in blocks 612, 614 and 616. In some alternative embodiments, the number of dummy vias to be inserted include the first number of dummy vias minus the dummy vias removed/canceled in blocks 612, 614 and 616.

The present disclosure provides methods and structures to preventing plasma induced damages. Methods of the present disclosure practice multiple mechanisms to reduce the number of dummy vias, remove/cancel dummy vias that may bridge horizontally spaced conductive lines, and remove/cancel dummy vias that may vertically couple conductive lines in vertically adjacent metal layers. Compared to conventional dummy via insertion process, methods of the present disclosure may prevent formation of large floating daisy chain structures that may accumulate excessive charges induced by plasma.

In one embodiment, a method is provided. The method includes receiving a design layout, performing routing to the design layout to obtain a routed layout including an interconnect structure that includes a first metal layer, a second metal layer over the first metal layer, a third metal layer over the second metal layer, and a plurality of functional vias, performing optical proximity correction (OPC) operations to the routed layout to obtain an OPC'ed layout including dense regions and isolated regions, determining a first number of nominal dummy vias to be inserted into the isolated regions, reducing the first number of nominal dummy vias to a second number of nominal dummy vias, and modifying the OPC'ed layout based on the second number of nominal dummy vias to obtain a modified layout. The modifying includes inserting the second number of nominal dummy vias in the OPC'ed layout.

In some embodiments, the second number is between about 80% and about 90% of the first number. In some implementations, the modifying includes removing nominal dummy vias in the second number of nominal dummy vias to avoid horizontal bridging between two adjacent metal lines in the first metal layer. In some instances, the removing of the nominal dummy vias in the second number of nominal dummy vias includes identifying a bridging metal line in the second metal layer, wherein the bridging metal line spans over two adjacent metal lines in the first metal layer, and removing nominal dummy vias in the second number of nominal dummy vias that are electrically coupled to the bridging metal line. In some embodiments, the removing of the nominal dummy vias in the second number of nominal dummy vias includes identifying a boundary between an OPC region and a non-OPC region, identifying a dummy-via-free zone immediate adjacent the boundary, and removing nominal dummy vias in the second number of nominal dummy vias that fall within the dummy-via-free zone. In some implementations, the modifying includes removing nominal dummy vias in the second number of nominal dummy vias to avoid vertical coupling between a conductive line in the first metal layer and a conductive line in the second metal layer. In some embodiments, the removing of the nominal dummy vias in the second number of nominal dummy vias includes identifying a connected metal line in the second metal layer, wherein the connected metal line is electrically coupled to a metal line in the first metal layer, and removing nominal dummy vias in the second number of nominal dummy vias that are electrically coupled to the connected metal line. In some instances, the method further includes fabricating a set of photolithography masks based on the modified layout. In some embodiments, the method further includes fabricating a semiconductor device using the set of photolithography masks.

In another embodiment, a system is provided. The system includes a computing device configured to receive a design layout, perform routing to the design layout to obtain a routed layout including an interconnect structure including a first metal layer, a second metal layer over the first metal layer, a third metal layer over the second metal layer, and a plurality of functional vias, perform optical proximity correction (OPC) operations to the routed layout to obtain an OPC'ed layout having dense regions and isolated regions, determine a first number of nominal dummy vias to be inserted into the isolated regions, reduce the first number of nominal dummy vias to a second number of nominal dummy vias, and modify the OPC'ed layout based on the second number of nominal dummy vias to obtain a modified layout. In this embodiment, the modifying of the OPC'ed layout includes inserting the second number of nominal dummy vias in the OPC'ed layout.

In some embodiments, wherein the second number is between about 80% and about 90% of the first number. In some implementations, the modifying includes removing nominal dummy vias in the second number of nominal dummy vias to avoid horizontal bridging between two adjacent metal lines in the first metal layer. In some instances, the removing of the nominal dummy vias in the second number of nominal dummy vias includes identifying a bridging metal line in the second metal layer, wherein the bridging metal line spans over two adjacent metal lines in the first metal layer; and removing nominal dummy vias in the second number of nominal dummy vias that are electrically coupled to the bridging metal line. In some embodiments, the removing of the nominal dummy vias in the second number of nominal dummy vias includes identifying a boundary between an OPC region and a non-OPC region, identifying a dummy-via-free zone immediate adjacent the boundary, and removing nominal dummy vias in the second number of nominal dummy vias that fall within the dummy-via-free zone. In some implementations, the modifying includes removing nominal dummy vias in the second number of nominal dummy vias to avoid vertical coupling between a conductive line in the first metal layer and a conductive line in the second metal layer. In some instances, the removing of the nominal dummy vias in the second number of nominal dummy vias includes identifying a connected metal line in the second metal layer, wherein the connected metal line is electrically coupled to a metal line in the first metal layer, and removing nominal dummy vias in the second number of nominal dummy vias that are electrically coupled to the connected metal line. In some embodiments, the system of claim 10 is in communication with an E-beam writer, wherein the computing device is further configured to output the modified layout to the E-beam writer to fabricate a set of photolithography masks based on the modified layout.

In still another embodiment, a method is provided. The method includes receiving a design layout, performing routing to the design layout to obtain a routed layout including an interconnect structure including a first metal layer, a second metal layer over the first metal layer, a third metal layer over the second metal layer, and a plurality of functional vias, performing optical proximity correction (OPC) operations to the routed layout to obtain an OPC'ed layout having dense regions and isolated regions, determining a number of nominal dummy vias to be inserted into the isolated regions, and modifying the OPC'ed layout based on the number of nominal dummy vias to obtain a modified layout. The modifying includes removing nominal dummy vias in the number of nominal dummy vias to avoid horizontal bridging between two adjacent metal lines in the first metal layer.

In some embodiments, the modifying further includes removing nominal dummy vias in the number of nominal dummy vias to avoid vertical coupling between a conductive line in the first metal layer and a conductive line in the second metal layer. In some embodiments, the modifying further includes reducing the number of nominal dummy vias to a reduced number of nominal dummy vias.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   receiving a design layout;
   performing routing to the design layout to obtain a routed layout comprising an interconnect structure including a first metal layer, a second metal layer over the first metal layer, a third metal layer over the second metal layer, and a plurality of functional vias;
   performing optical proximity correction (OPC) operations to the routed layout to obtain an OPC'ed layout comprising dense regions and isolated regions;
   determining a first number of nominal dummy vias to be inserted into the isolated regions;
   reducing the first number of nominal dummy vias to a second number of nominal dummy vias; and
   modifying the OPC'ed layout based on the second number of nominal dummy vias to obtain a modified layout, wherein the modifying comprises:
      inserting the second number of nominal dummy vias in the OPC'ed layout, and
      removing nominal dummy vias in the second number of nominal dummy via to avoid horizontal bridging between two adjacent metal lines in the first metal layer, wherein the removing comprises:
         identifying a bridging metal line in the second metal layer, wherein the bridging metal line spans over two adjacent metal lines in the first metal layer, and
         removing nominal dummy vias in the second number of nominal dummy vias that are electrically coupled to the bridging metal line.

2. The method of claim 1, wherein the second number is between about 80% and about 90% of the first number.

3. The method of claim 1, wherein the removing of the nominal dummy vias in the second number of nominal dummy vias comprises:
   identifying a boundary between an OPC region and a non-OPC region;
   identifying a dummy-via-free zone immediate adjacent the boundary; and
   removing nominal dummy vias in the second number of nominal dummy vias that fall within the dummy-via-free zone.

4. The method of claim 1, wherein the modifying comprises:
   removing nominal dummy vias in the second number of nominal dummy vias to avoid vertical coupling between a conductive line in the first metal layer and a conductive line in the second metal layer.

5. The method of claim 4, wherein the removing of the nominal dummy vias in the second number of nominal dummy vias comprises:
   identifying a connected metal line in the second metal layer, wherein the connected metal line is electrically coupled to a metal line in the first metal layer; and
   removing nominal dummy vias in the second number of nominal dummy vias that are electrically coupled to the connected metal line.

6. The method of claim 1, further comprising fabricating a set of photolithography masks based on the modified layout.

7. The method of claim 6, further comprising fabricating a semiconductor device using the set of photolithography masks.

8. The method of claim 1,
   wherein the first number of nominal dummy vias comprises:
      a first nominal dummy via coupling a first metal line in the first metal layer to a second metal line in the second metal layer, and
      a second nominal dummy via coupling the second metal line to a third metal line in the third metal layer,
   wherein the modifying comprises removing the second nominal dummy via to prevent electrical coupling between the first metal line and the third metal line.

9. A system, comprising:
   a computing device configured to:
      receive a design layout;
      perform routing to the design layout to obtain a routed layout comprising an interconnect structure including a first metal layer, a second metal layer over the first metal layer, a third metal layer over the second metal layer, and a plurality of functional vias;
      perform optical proximity correction (OPC) operations to the routed layout to obtain an OPC'ed layout comprising dense regions and isolated regions;
      determine a first number of nominal dummy vias to be inserted into the isolated regions;
      reduce the first number of nominal dummy vias to a second number of nominal dummy vias; and
      modify the OPC'ed layout based on the second number of nominal dummy vias to obtain a modified layout, wherein the modifying of the OPC'ed layout comprises:
         inserting the second number of nominal dummy vias in the OPC'ed layout,
         removing nominal dummy vias in the second number of nominal dummy vias to avoid horizontal bridging between two adjacent metal lines in the first metal layer,
      wherein removing comprises:
         identifying a boundary between an OPC region and a non-OPC region,
         identifying a dummy-via-free zone immediate adjacent the boundary, and
         removing nominal dummy vias in the second number of nominal dummy vias that fall within the dummy-via-free zone.

10. The system of claim 9, wherein the second number is between about 80% and about 90% of the first number.

11. The system of claim 9, wherein the removing of the nominal dummy vias in the second number of nominal dummy vias comprises:
    identifying a bridging metal line in the second metal layer, wherein the bridging metal line spans over two adjacent metal lines in the first metal layer; and removing nominal dummy vias in the second number of nominal dummy vias that are electrically coupled to the bridging metal line.

12. The system of claim 9, wherein the modifying comprises:
removing nominal dummy vias in the second number of nominal dummy vias to avoid vertical coupling between a conductive line in the first metal layer and a conductive line in the second metal layer.

13. The system of claim 12, wherein the removing of the nominal dummy vias in the second number of nominal dummy vias comprises:
identifying a connected metal line in the second metal layer, wherein the connected metal line is electrically coupled to a metal line in the first metal layer; and
removing nominal dummy vias in the second number of nominal dummy vias that are electrically coupled to the connected metal line.

14. The system of claim 9 is in communication with an E-beam writer, wherein the computing device is further configured to output the modified layout to the E-beam writer to fabricate a set of photolithography masks based on the modified layout.

15. The system of claim 9,
wherein the first number of nominal dummy vias comprises:
a first nominal dummy via coupling a first metal line in the first metal layer to a second metal line in the second metal layer, and
a second nominal dummy via coupling the second metal line to a third metal line in the third metal layer,
wherein the modifying comprises removing the second nominal dummy via to prevent electrical coupling between the first metal line and the third metal line.

16. A method, comprising:
receiving a design layout;
performing routing to the design layout to obtain a routed layout comprising an interconnect structure including a first metal layer, a second metal layer over the first metal layer, a third metal layer over the second metal layer, and a plurality of functional vias;
performing optical proximity correction (OPC) operations to the routed layout to obtain an OPC'ed layout comprising dense regions and isolated regions;
determining a number of nominal dummy vias to be inserted into the isolated regions; and
modifying the OPC'ed layout based on the number of nominal dummy vias to obtain a modified layout,
wherein the OPC'ed layout further comprises:
a first metal line in the first metal layer,
a second metal line and a third metal line in the second metal layer, and
a fourth metal line in the third metal layer,
wherein the number of nominal dummy vias comprises:
a first nominal dummy via electrically coupling the second metal line and the first metal line, and
a second nominal dummy via electrically coupling the second metal line and the fourth metal line,
wherein the modifying comprises replacing the second nominal dummy via with a third nominal dummy via that electrically couples the third metal line and the fourth metal line.

17. The method of claim 16, wherein the modifying further comprises removing nominal dummy vias in the number of nominal dummy vias to avoid vertical coupling between a conductive line in the first metal layer and a conductive line in the second metal layer.

18. The method of claim 16, wherein the modifying further comprises reducing the number of nominal dummy vias to a reduced number of nominal dummy vias.

19. The method of claim 16, wherein the modifying comprises removing nominal dummy vias in the number of nominal dummy vias to avoid horizontal bridging between two adjacent metal lines in the first metal layer.

20. The method of claim 16, wherein the third metal line and the first metal line is not electrically coupled together by any of the number of nominal dummy vias.

* * * * *